Sept. 15, 1970 A. NOYES, JR 3,529,260
OSCILLATOR WITH FREQUENCY DIVIDERS FOR PROVIDING TUNABLE SINUSOIDAL OUTPUTS
Filed May 31, 1968
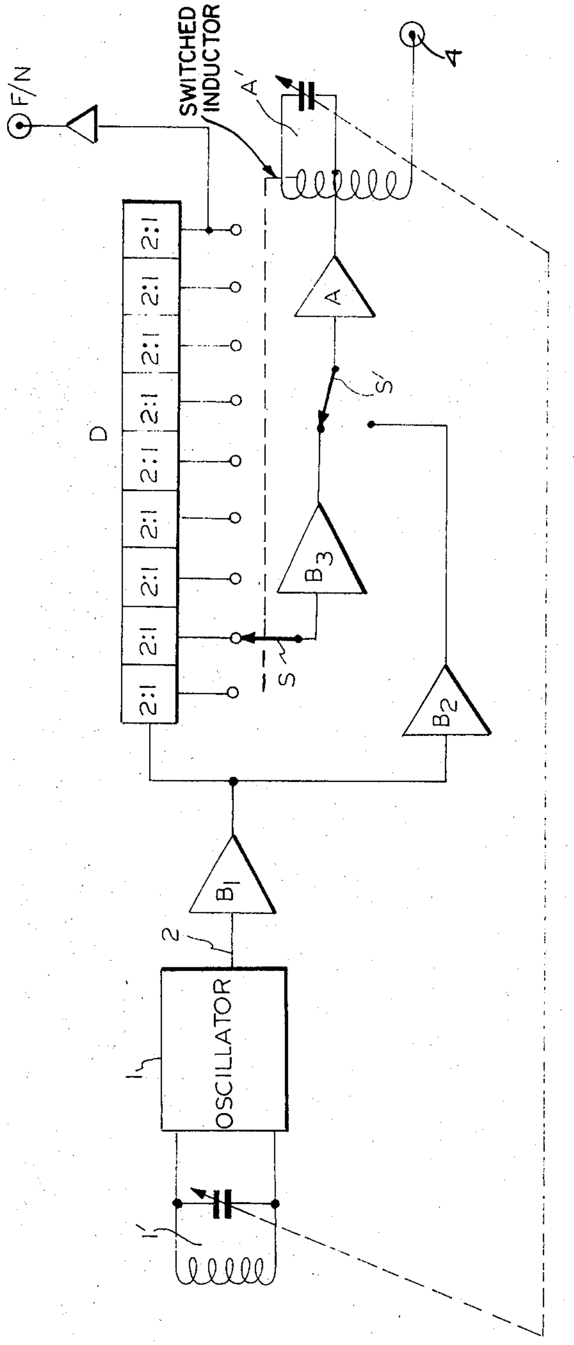
INVENTOR
ATHERTON NOYES JR
BY Rines and Rines
ATTORNEYS United States Patent Office 3,529,260
Patented Sept. 15, 1970

3,529,260
OSCILLATOR WITH FREQUENCY DIVIDERS FOR PROVIDING TUNABLE SINUSOIDAL OUTPUTS

Atherton Noyes, Jr., Concord, Mass., assignor to General Radio Company, West Concord, Mass., a corporation of Massachusetts Filed May 31, 1968, Ser. No. 733,593
Int. Cl. H03b *19/00*
U.S. Cl. 331—74 10 Claims

ABSTRACT OF THE DISCLOSURE

Signal generator in which a single high-stability oscillator with a continuously variable tuned circuit produces sine waves which are applied by a buffer amplifier to a frequency-divider chain, the square-wave output of any stage of the chain being selectively applied to a power amplifier with a tuned circuit ganged to that of the oscillator and with frequency-selective elements switched concurrently with the selection of the frequency-divider stages, thereby to generate sinusoidal oscillations of any desired frequency in any of successive frequency ranges.

The present invention relates to signal generator apparatus and, more specifically, to standard sinusoidal waveform signal generators covering a wide band of successive frequency ranges.

For many years, signal generators of the above-described type have been constructed with oscillator, buffer and power amplifier stages, each stage having a plurality of tuned circuits covering the successive frequency ranges and switchable in tracked fashion to attain coverage over the desired bands. There are many disadvantages inherent in such designs, including complexity, cost and size, deleterious switching transients, frequency uncertainties due to variable capacitive loading effects of the oscillator circuit switching contacts, pulling effects of the buffer and power amplifier upon the oscillator, and waiting time after switching for thermal stabilization of the oscillator, to mention a few. Such, however, was the best the art could provide until the advent of the present invention.

In accordance with the invention, an entirely different approach is employed embodying, in summary, only a single oscillator optimally designed to be tunable over a single frequency range of the generator and, in novel fashion, combined with a series of successively connected, preferably 2:1 frequency dividers to produce successively lower frequency ranges, while imparting the stability and calibration accuracy of the oscillator range to all other ranges without deterioration and without the need for a plurality of oscillator tuned circuits with the accompanying switching transients, loading effects or thermal-stabilizing waiting time after switching, before discussed.

While frequency dividers have been used as elements in other types of appartus, their use in continuous frequency sinusoidal waveform signal generators of the above-described type, and in the novel manner hereinafter set forth, has not been indicated in view of the very different problems existing therewith, as distinguished from such other apparatus. A synthesized-frequency source, for example, such as that disclosed in my Pat. 3,300,731 issued Jan. 24, 1967, uses frequency division, repetitively to shift selectable precision frequencies, spaced by relatively large amounts, to a lower frequency region with available spacing interval correspondingly reduced, for the purpose of achieving increased frequency resolution. However, until now it does not appear that the application of a similar process to continuously variable, free-running multiband signal generators has been employed to achieve results unrelated to those required in frequency synthesizers; namely, the elimination of frequency errors due to variable loading effects, changing thermal drifts in multiband oscillators, and uncorrelated calibration inaccuracies in the several bands. Frequency dividers, moreover, including binary dividers have been used in still other apparatus such as computers and counters, for such purposes as shifting decimal places or providing time coherence with the aid of generated timing pulses. But while the noise and multiple harmonic content of such pulse trains is of no deleterious significance in such applications, such are the antithesis of the pure sinusoidal oscillation waveforms required of standard signal generators.

Despite such apparent contra-indication of usage in multi-band continuous frequency signal generator applications, it has been discovered, in summary, that frequency dividers can be adapted to be employed in a novel manner in such generators for the highly significant purposes of eliminating the necessity for multiple tuned oscillator circuits and the switching of the same, and to do so while enabling the generation of continuous pure sinusoidal waveforms.

An object of the invention, accordingly, is to provide a new and improved signal generator void of the prior-art disadvantages before-discussed.

Other and further objects will be set forth hereinafter and are more particularly delineated in the appended claims.

The invention will now be described with reference to the accompanying drawing the single figure of which is a combined schematic and block diagram illustrating the invention in preferred form.

Referring to the drawing, an oscillator stage 1 is shown provided with a single tuned circuit 1', tunable over the highest frequency range of the signal generator and designed for optimal frequency stability. As a concrete example, taken from a practical system, consider this oscillator to cover the frequency range from 34–80 mHz. The sinusoidal oscillator output is fed at 2 through an untuned buffer stage $B_1$ to a series D of successively connected or cascaded 2:1 frequency dividers, shown in this example as a chain of nine. Well-known "flip-flop" dividers, utilizing transistors or tunnel diodes and the like may be so employed. The output waveform of such a "flip-flop" is generally a square wave (with 50% duty ratio) which is readily converted to a sine wave by low-pass or band-pass filtering. A switch S selectively contacts the outputs of the successive divider circuits, being shown connected with the second 2:1 divider circuit output from the left. The resulting substantially square-wave output train of each divider circuit (having portions corresponding to both the positive and negative half-cycles of the original oscillator waveform, as distinguished from mere timing pulses) is applied through a further untuned buffer $B_3$ and a further switch S', when in its upper position, as shown, to a power amplifier stage A having conventional tunable tuned circuit means A', tracking with the tuning of the oscillator tuned circuit 1', as indicated schematically by the dash lines. The inductor of this amplifier circuit is selected for each range by band switch or coil turret (not shown). The output from the divider circuits becomes thus reconverted into pure sinusoidal waveform in the power amplifier A–A', such that the signal generator output is extracted at 4. In a complete signal generator, of course, suitable provisions will be made for modulations, levelling and precision attenuation of the output signal, by standard well-known techniques.

The nine 2:1 dividers, in the above example, provide a maximum divisor of $2^9$ or 512, such that the lowest frequency range produced by the entire cascaded divider chain at the right-most 2:1 divider, is the highest frequency range (34–80 mHz.) divided by 512, or 67 kHz. to 156 kHz. This low range output is available as the labelled F/N monitor output, being an exact integral fraction N of the actual output F, always falling between approximately 67 and 156 kHz. in this example. The proper value of N may be displayed on the tuning dial of each selected frequency range. N varies from 1 to 512 in binary steps, and is equal to 1 for the lowest frequency range and 512 for the highest in the example discussed. Such an unmodulated monitor output is very useful for such purposes as measuring or monitoring output frequency indirectly with an inexpensive low-frequency counter, even with full modulation applied to the power amplifier stage.

When switch S′ is actuated to its other position, the divider chain D becomes disconnected from the power amplifier A–A′, which then is fed through the untuned buffer $B_2$ from the oscillator 1, directly, to pass the highest frequency range of oscillations.

The invention inherently provides a high degree of isolation between the oscillator 1–1′ and the power amplifier A–A′ under all conditions, practically eliminating all frequency-pulling effects from changes in operating and loading conditions at the output stage. As before stated, range-switching effects on frequency are also eliminated, since the oscillator is never switched, and no time is wasted in waiting for the frequency to restabilize after band switching, as in prior-art signal generators. When a particular range is selected at S, the appropriate number of dividers is activated and the appropriate turret tank circuit A′ is connected to the power amplifier A, with the variable tuning capacitor ganged with the variable capacitor of the oscillator tuned circuit 1′, as illustrated in dash lines.

It should be emphasized that the frequency calibrations of all bands are exactly related (by the exact $2^n$:1 division) to the calibration of the precision driving oscillator, and the stability of frequency, in the presence of adverse temperature or other environmental conditions, is exactly the same (in percentage) for all bands and controlled solely by the excellence of the design of the single precision oscillator 1. Thus, unlike all prior signal generators, of this type, only one precision oscillator is required, to achieve superb performance in all bands.

Furthermore, since the precision oscillator operates under the same thermal conditions, no matter what band is selected, there is no "warm-up" drift after band change, as there is in any signal generator employing band-switching of the oscillator.

Division by 2, while convenient, is not to be considered a restriction on this invention. Division by 3 or by 4, for example, could be used to reduce the number of required bands, if a wider-range precision oscillator is available; and, of course, it is also possible to include frequency bands obtained by multiplication of the precision oscillator frequency, as well as by division, (the multiplication being equivalent to division by $2^n$, where $n$ is now a negative integer) to extend the frequency coverage still further.

Further modifications will also occur to those skilled in this art and all such are considered to fall within the spirit and scope of the invention.

What is claimed is:

1. Signal generator apparatus for generating sinusoidal oscillations of any desired frequency in any of a plurality of successive ranges having, in combination, an oscillator with a tuned circuit continuously variable only over a single frequency range for producing oscillations of any selected frequency in said single range, a series of successive frequency divider circuits connected with the oscillator to provide in corresponding successive frequency ranges substantially squarewave outputs of successively lower frequency than said selected frequency, and power amplifier means connected selectively with each of said divider circuit outputs and provided with tuned circuit means controlled in tracking relationship with the tuning of the oscillator for re-generating sinusoidal oscillations from the divider circuit output to which it is connected.

2. Signal generator apparatus as claimed in claim 1 and in which said frequency divider circuits comprise two-to-one dividers.

3. Signal generator apparatus as claimed in claim 1 and in which said oscillator produces sinusoidal oscillations and buffer means is connected between said oscillator and the first of said frequency divider circuits for passing the last-mentioned oscillations to said first frequency divider circuit.

4. Signal generator apparatus as claimed in claim 1 and in which buffer means is disposed in the selective connection between each of said divider circuit outputs and said power amplifier means.

5. Signal generator apparatus as claimed in claim 1 and in which means is provided for disconnecting said divider circuit outputs from said power amplifier means and for connecting said oscillator through buffer means to said power amplifier means directly to apply oscillations of said oscillator range to said power amplifier means.

6. Signal generator apparatus as claimed in claim 1 and in which means is provided connected with the output of the last of the said series of frequency divider circuits for indicating the integral fraction $1/N$ of the output frequency available at said divider circuit output, where N is determined by the choice of the output frequency range of the signal generator apparatus.

7. Signal generator apparatus as claimed in claim 1, in which the output frequency is equal to the oscillator frequency divided by $2^n$ where $n$ may have any positive or negative integral value, including zero.

8. Signal generator apparatus as claimed in claim 1 and in which said oscillator produces substantially sinusoidal waveform oscillations over the highest of said ranges only.

9. Signal generator apparatus as claimed in claim 3 and in which said power amplifier means has frequency-selective elements selectively connected thereto concurrently with the selective connection of said divider circuit outputs to said power amplifier means.

10. Signal generator apparatus as claimed in claim 10 and in which buffer means is disposed in the selective connection between each of said divider circuit outputs and said power amplifier means.

References Cited

UNITED STATES PATENTS

| | | | |
|---|---|---|---|
| 2,710,921 | 6/1955 | Melsheimer | 328—25 |
| 2,829,255 | 4/1958 | Bolie | 331—76 X |
| 2,924,776 | 2/1960 | Peterson | 328—25 X |
| 3,355,539 | 11/1967 | Munch et al. | 328—18 X |

ROY LAKE, Primary Examiner

S. H. GRIMM, Assistant Examiner

U.S. Cl. X.R.

307—261; 321—60; 328—18, 22, 25; 331—77, 177, 179